(12) United States Patent
Hebert

(10) Patent No.: US 10,446,677 B2
(45) Date of Patent: Oct. 15, 2019

(54) SEMICONDUCTOR STRUCTURES AND METHOD FOR FABRICATING THE SAME

(71) Applicant: Vanguard International Semiconductor Corporation, Hsinchu (TW)

(72) Inventor: Francois Hebert, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/923,134

(22) Filed: Mar. 16, 2018

(65) Prior Publication Data

US 2019/0288099 A1 Sep. 19, 2019

(51) Int. Cl.
*H01L 27/12* (2006.01)
*H01L 29/778* (2006.01)
(Continued)

(52) U.S. Cl.
CPC ...... *H01L 29/7787* (2013.01); *H01L 21/0242* (2013.01); *H01L 21/0254* (2013.01); *H01L 21/02376* (2013.01); *H01L 21/02378* (2013.01); *H01L 21/02458* (2013.01); *H01L 21/02488* (2013.01); *H01L 21/02505* (2013.01); *H01L 21/2654* (2013.01); *H01L 21/30612* (2013.01); *H01L 21/76224* (2013.01); *H01L 21/84* (2013.01); *H01L 23/3731* (2013.01); *H01L 23/3732* (2013.01); *H01L 23/3738* (2013.01); *H01L 27/0605* (2013.01);
(Continued)

(58) Field of Classification Search
CPC ........... H01L 29/7787; H01L 21/02376; H01L 21/02378; H01L 21/0242; H01L 21/02458; H01L 21/02488; H01L 21/02505; H01L 21/0254; H01L 21/2654; H01L 21/30612; H01L 21/76224; H01L 21/84; H01L 23/3731; H01L 23/3732; H01L 23/3738; H01L 27/0605; H01L 27/1203; H01L 29/0649; H01L 29/0843; H01L 29/1075; H01L 29/2003; H01L 29/205; H01L 29/66462
USPC ......................................................... 257/76
See application file for complete search history.

(56) References Cited

U.S. PATENT DOCUMENTS

| 2011/0156682 | A1* | 6/2011 | Girdhar ............... | H01L 27/0629 323/283 |
| 2017/0069661 | A1* | 3/2017 | Zhang ................. | H01L 27/1203 |

(Continued)

*Primary Examiner* — Didarul A Mazumder
(74) *Attorney, Agent, or Firm* — Birch, Stewart, Kolasch & Birch, LLP

(57) ABSTRACT

A semiconductor structure is provided. The semiconductor structure includes an insulating substrate including a first region and a second region; an engineered layer surrounding the insulating substrate; a nucleation layer formed on the engineered layer; a buffer layer formed on the nucleation layer; a first epitaxial layer formed on the buffer layer; a second epitaxial layer formed on the first epitaxial layer; an isolation structure at least formed in the second epitaxial layer, the first epitaxial layer and the nucleation layer, and located between the first region and the second region; a first gate, a first source and a first drain formed on the second epitaxial layer within the first region; and a second gate, a second source, and a second drain formed on the second epitaxial layer within the second region.

29 Claims, 22 Drawing Sheets

(51) Int. Cl.
*H01L 29/66* (2006.01)
*H01L 29/06* (2006.01)
*H01L 29/08* (2006.01)
*H01L 23/373* (2006.01)
*H01L 29/20* (2006.01)
*H01L 29/205* (2006.01)
*H01L 21/02* (2006.01)
*H01L 21/762* (2006.01)
*H01L 21/84* (2006.01)
*H01L 21/306* (2006.01)
*H01L 21/265* (2006.01)
*H01L 27/06* (2006.01)
*H01L 29/10* (2006.01)

(52) U.S. Cl.
CPC ...... *H01L 27/1203* (2013.01); *H01L 29/0649* (2013.01); *H01L 29/0843* (2013.01); *H01L 29/1075* (2013.01); *H01L 29/2003* (2013.01); *H01L 29/205* (2013.01); *H01L 29/66462* (2013.01)

(56) References Cited

U.S. PATENT DOCUMENTS

2017/0288055 A1* 10/2017 Aktas ................. H01L 27/1203
2017/0309676 A1* 10/2017 Odnoblyudov ......... H01L 27/15

* cited by examiner

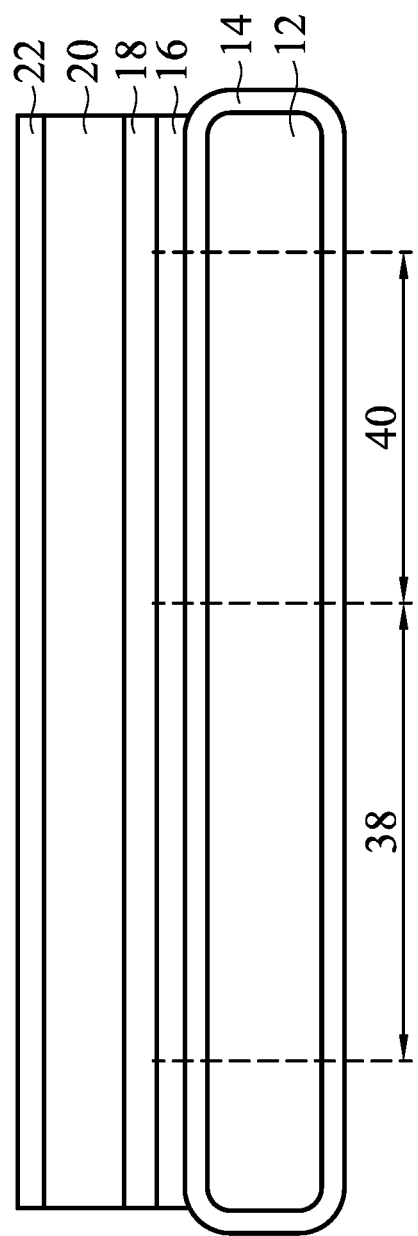

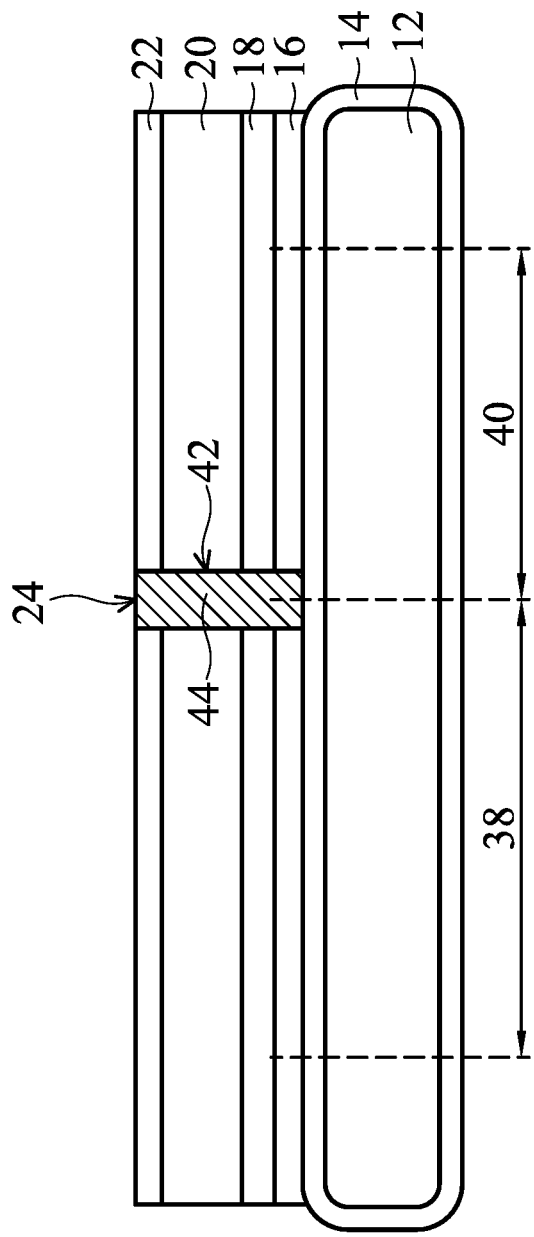

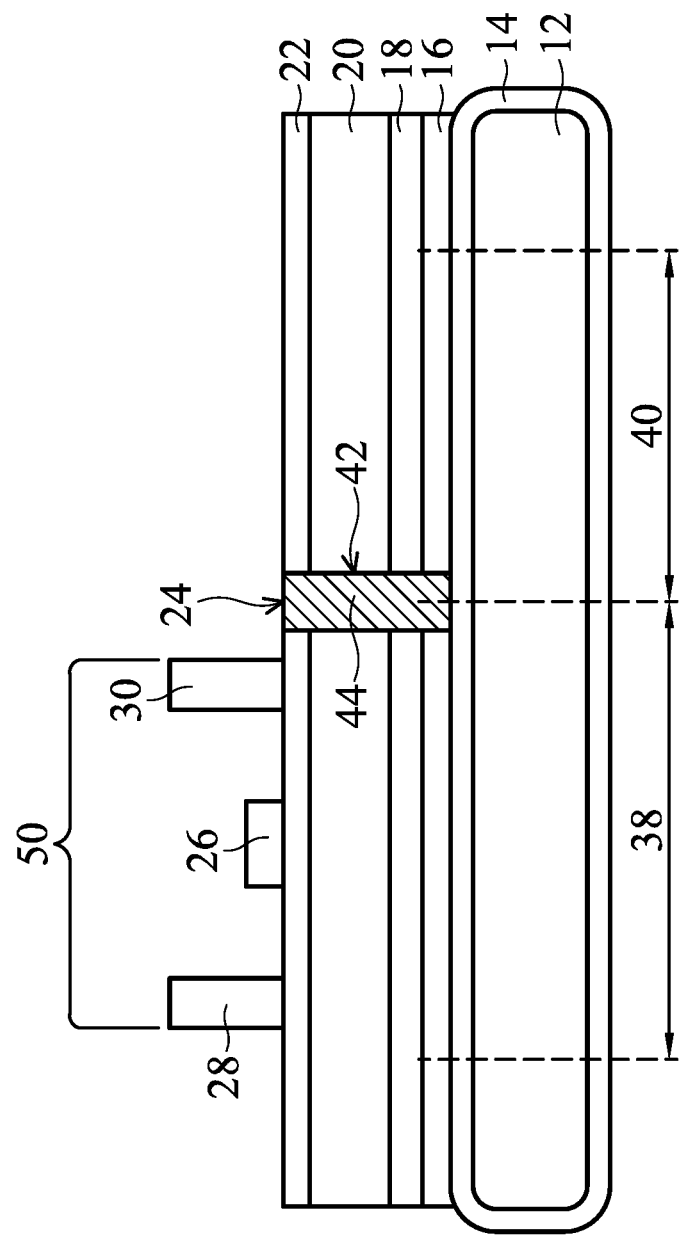

SEMICONDUCTOR STRUCTURES AND METHOD FOR FABRICATING THE SAME

TECHNICAL FIELD

The technical field relates to a semiconductor structure with an insulating core substrate therein without bias connection, and a method for fabricating the same.

BACKGROUND

GaN is a semiconductor with excellent physical properties, such as a large bandgap, a high electric breakdown field, and relatively high electron mobility. Devices fabricated on this semiconductor are especially suitable for use in power electronic applications. Studies show that the Group III-nitride semiconductors of a hetero-structure of AlGaN/GaN are an excellent material system for fabricating high electron mobility transistors (HEMT). The structure supplies an excellent and unique combination of high carrier concentration and high carrier mobility.

There is a requirement to isolate GaN devices for integrated circuit applications. Conventionally, a lateral isolation structure formed by ion-implantation or shallow etching is used to interrupt a highly conductive two-dimensional electron gas (2DEG) layer that forms a channel of HEMT devices. However, this isolation structure is not adequate for multiple devices at different bias conditions (i.e. different voltages applied to the terminals of the devices) due to generation of a back bias effect from a semiconductor substrate. The back bias effect will impact the breakdown voltages and the electrical characteristics of the transistors.

Therefore, development of a semiconductor structure with a simple and appropriate isolation structure and being capable of eliminating the back bias effect is desirable.

SUMMARY

In accordance with one embodiment of the disclosure, a semiconductor structure is provided. The semiconductor structure comprises an insulating substrate, an engineered layer, a nucleation layer, a buffer layer, a first epitaxial layer, a second epitaxial layer, an isolation structure, a first gate, a first source, a first drain, a second gate, a second source, and a second drain. The insulating substrate comprises a first region and a second region. The engineered layer surrounds the insulating substrate. The nucleation layer is formed on the engineered layer. The buffer layer is formed on the nucleation layer. The first epitaxial layer is formed on the buffer layer. The second epitaxial layer is formed on the first epitaxial layer. The isolation structure is at least formed in the second epitaxial layer, the first epitaxial layer and the nucleation layer. The isolation structure is located between the first region and the second region. The first gate is formed on the second epitaxial layer within the first region. The first source and the first drain are formed on the second epitaxial layer within the first region. The first source and the first drain are located on both sides of the first gate. The second gate is formed on the second epitaxial layer within the second region. The second source and the second drain are formed on the second epitaxial layer within the second region. The second source and the second drain are located on both sides of the second gate.

In accordance with some embodiments, the insulating substrate has a coefficient of thermal expansion (CTE) that is similar to the CTE of the first epitaxial layer.

In accordance with some embodiments, the insulating substrate has a bulk resistivity that is greater than $10^6$ ohm-cm.

In accordance with some embodiments, the insulating substrate has a thermal conductivity that is higher than that of silicon.

In accordance with some embodiments, the insulating substrate comprises aluminum nitride, polycrystalline silicon carbide, polycrystalline diamond, or a mixture of different polycrystalline materials, or other suitable insulating material.

In accordance with some embodiments, the engineered layer comprises nitride, oxide, oxynitride or polysilicon.

In accordance with some embodiments, the nucleation layer comprises silicon <111>.

In accordance with some embodiments, the nucleation layer is crystalline.

In accordance with some embodiments, the nucleation layer has a thickness that is in a range from about 0.1 µm to about 5 µm.

In accordance with some embodiments, the buffer layer comprises aluminum gallium nitride or aluminum nitride.

In accordance with some embodiments, the first epitaxial layer comprises gallium nitride.

In accordance with some embodiments, the second epitaxial layer comprises aluminum gallium nitride.

In accordance with some embodiments, a third epitaxial layer is further formed on the second epitaxial layer.

In accordance with some embodiments, the third epitaxial layer is a p-type gallium nitride layer.

In accordance with some embodiments, the isolation structure comprises a trench filled with an insulating material passing through the second epitaxial layer, the first epitaxial layer, the buffer layer, and the nucleation layer.

In accordance with some embodiments, the isolation structure comprises a trench filled with an insulating material passing through the second epitaxial layer, the first epitaxial layer, the buffer layer, the nucleation layer, and a portion of the engineered layer.

In accordance with some embodiments, the isolation structure comprises a first implant region and a second implant region.

In accordance with some embodiments, the first implant region is located in the second epitaxial layer and the first epitaxial layer.

In accordance with some embodiments, the second implant region is located in the nucleation layer.

In accordance with some embodiments, the isolation structure comprises a continuous implant region covering the second epitaxial layer, the first epitaxial layer, the buffer layer, and the nucleation layer.

In accordance with some embodiments, the first gate, the first source and the first drain constitute a high-voltage device.

In accordance with some embodiments, the second gate, the second source and the second drain constitute a low-voltage device or a high-voltage device.

In accordance with one embodiment of the disclosure, a method for fabricating a semiconductor structure is provided. The fabrication method comprises the following steps. An insulating substrate with an engineered layer surrounding the insulating substrate is provided. The insulating substrate comprises a first region and a second region. A nucleation layer is formed on the engineered layer. A buffer layer is formed on the nucleation layer. A first epitaxial layer is formed on the buffer layer. A second epitaxial layer is formed on the first epitaxial layer. An isolation structure is formed at least in the second epitaxial layer, the first epitaxial layer and the nucleation layer. The isolation structure is located between the first region and the second region. A first gate is formed on the second epitaxial layer within the first region. A first source and a first drain are formed on the second epitaxial layer within the first region. The first source and the first drain are located on both sides of the first gate. A second gate is formed on the second epitaxial layer within the second region. A second source and a second drain are formed on the second epitaxial layer within the second region. The second source and the second drain are located on both sides of the second gate.

In accordance with some embodiments, the isolation structure is formed by etching a trench passing through the second epitaxial layer, the first epitaxial layer, the buffer layer, and the nucleation layer, and then filling an insulating material into the trench.

In accordance with some embodiments, the isolation structure is formed by etching a trench passing through the second epitaxial layer, the first epitaxial layer, the buffer layer, the nucleation layer, and a portion of the engineered layer, and then filling an insulating material into the trench.

In accordance with some embodiments, the isolation structure is formed by etching a trench passing through the second epitaxial layer, the first epitaxial layer, the buffer layer, the nucleation layer, and the engineered layer, and then filling an insulating material into the trench.

In accordance with some embodiments, the isolation structure is formed by performing a first implantation on the second epitaxial layer and the first epitaxial layer.

In accordance with some embodiments, the isolation structure is formed by further performing a second implantation on the nucleation layer.

In accordance with some embodiments, the isolation structure is formed by performing an implantation on the second epitaxial layer, the first epitaxial layer, the buffer layer, and the nucleation layer.

In the semiconductor structure disclosed by the present invention, an insulating core substrate (such as aluminum nitride) having the following appropriate characteristics, for example, similar coefficient of thermal expansion (CTE) to those of transistor material layers, high bulk resistivity, high thermal conductivity and low cost, which is further surrounded by a particular engineered layer (such as oxide, nitride, oxynitride or polysilicon) is used to replace a conventional semiconductor silicon substrate. A simple isolation structure, such as a single trench filled with an insulating material or separated implant regions (including a shallow implant region and a deep implant region), is also formed in this semiconductor structure to destroy a two-dimensional electron gas (2DEG) layer and to block a semiconductor nucleation layer to ensure that no electrical connection is formed between adjacent devices. Therefore, there is no need to form a bias connection to the substrate and no need to form complex and expensive conductors in deep trenches to connect the nucleation layer or the substrate since the core substrate is an insulator (no back bias effect occurs). The disclosure provides simple process steps and electrical connection indeed. In addition, multiple devices (such as active devices and/or passive devices) whose terminals are applied by different electrical voltages are capable of being integrated on the same die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 6A-6H are cross-sectional views of a method for fabricating a semiconductor structure in accordance with one embodiment of the disclosure.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
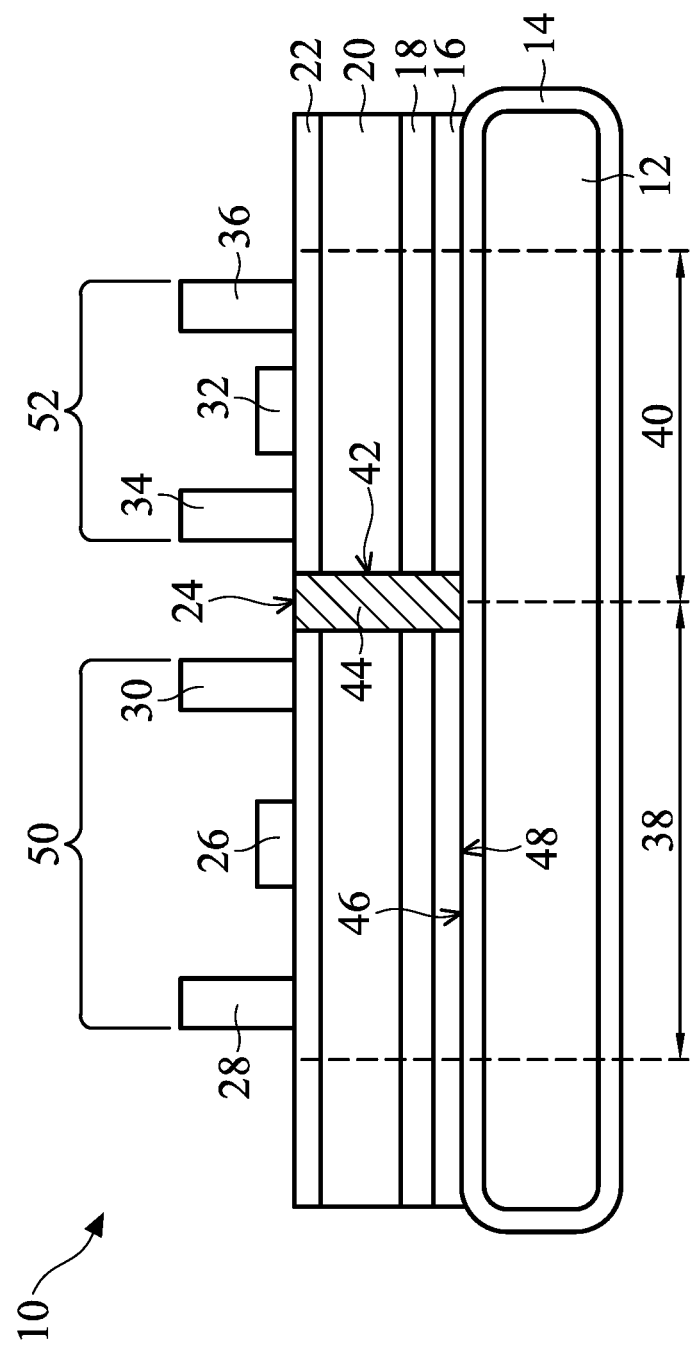
FIG. 1 is a cross-sectional view of a semiconductor structure in accordance with one embodiment of the disclosure.

Referring to FIG. 1, in accordance with one embodiment of the disclosure, a semiconductor structure 10 is provided. FIG. 1 is a cross-sectional view of the semiconductor structure 10.

As shown in FIG. 1, in this embodiment, the semiconductor structure 10 comprises an insulating substrate 12, an engineered layer 14, a nucleation layer 16, a buffer layer 18, a first epitaxial layer 20, a second epitaxial layer 22, an isolation structure 24, a first gate 26, a first source 28, a first drain 30, a second gate 32, a second source 34 and a second drain 36.

When the first gate 26 or the second gate 32 is metal, the device comprising the metal gate is a depletion mode normally-on device. When the first gate 26 or the second gate 32 consists of a p-GaN layer with metal on top, the device comprising the p-GaN gate is an enhancement mode normally-off device.

As shown in FIG. 1, the insulating substrate 12 comprises a first region 38 and a second region 40. The engineered layer 14 surrounds the insulating substrate 12. The nucleation layer 16 is formed on the engineered layer 14. The buffer layer 18 is formed on the nucleation layer 16. The first epitaxial layer 20 is formed on the buffer layer 18. The second epitaxial layer 22 is formed on the first epitaxial layer 20. Specifically, the isolation structure 24 is at least formed in the second epitaxial layer 22, the first epitaxial layer 20 and the nucleation layer 16. The isolation structure 24 is located between the first region 38 and the second region 40. The first gate 26 is formed on the second epitaxial layer 22 within the first region 38. The first source 28 and the first drain 30 are formed on the second epitaxial layer 22 within the first region 38. The first source 28 and the first drain 30 are located on both sides of the first gate 26. In addition, the second gate 32 is formed on the second epitaxial layer 22 within the second region 40. The second source 34 and the second drain 36 are formed on the second epitaxial layer 22 within the second region 40. The second source 34 and the second drain 36 are located on both sides of the second gate 32.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

In accordance with some embodiments, the buffer layer 18 may comprise aluminum gallium nitride or aluminum nitride.

In accordance with some embodiments, the first epitaxial layer 20 may comprise gallium nitride.

In accordance with some embodiments, the second epitaxial layer 22 may comprise aluminum gallium nitride.

In accordance with some embodiments, the isolation structure 24 may comprise a trench filled with an insulating material or an implant region.

In this embodiment, the isolation structure 24 comprises a trench 42 filled with an insulating material 44 passing through the second epitaxial layer 22, the first epitaxial layer 20, the buffer layer 18 and the nucleation layer 16. That is, the isolation structure 24 extends from the second epitaxial layer 22 to the bottom surface 46 of the nucleation layer 16 (i.e. the top surface 48 of the nucleation layer 14).

In accordance with some embodiments, the insulating material 44 filled into the trench 42 may comprise oxide, nitride followed by oxide, or oxide followed by polysilicon.

In accordance with some embodiments, the trench 42 may leave an "air gap" or "void" therein, as long as the top of the trench 42 is "sealed" so that no material falls or gets trapped inside the trench 42.

In accordance with some embodiments, the first gate 26, the first source 28 and the first drain 30 constitute a high-voltage device 50.

In accordance with some embodiments, the second gate 32, the second source 34 and the second drain 36 constitute a low-voltage device 52.

Figure 2:
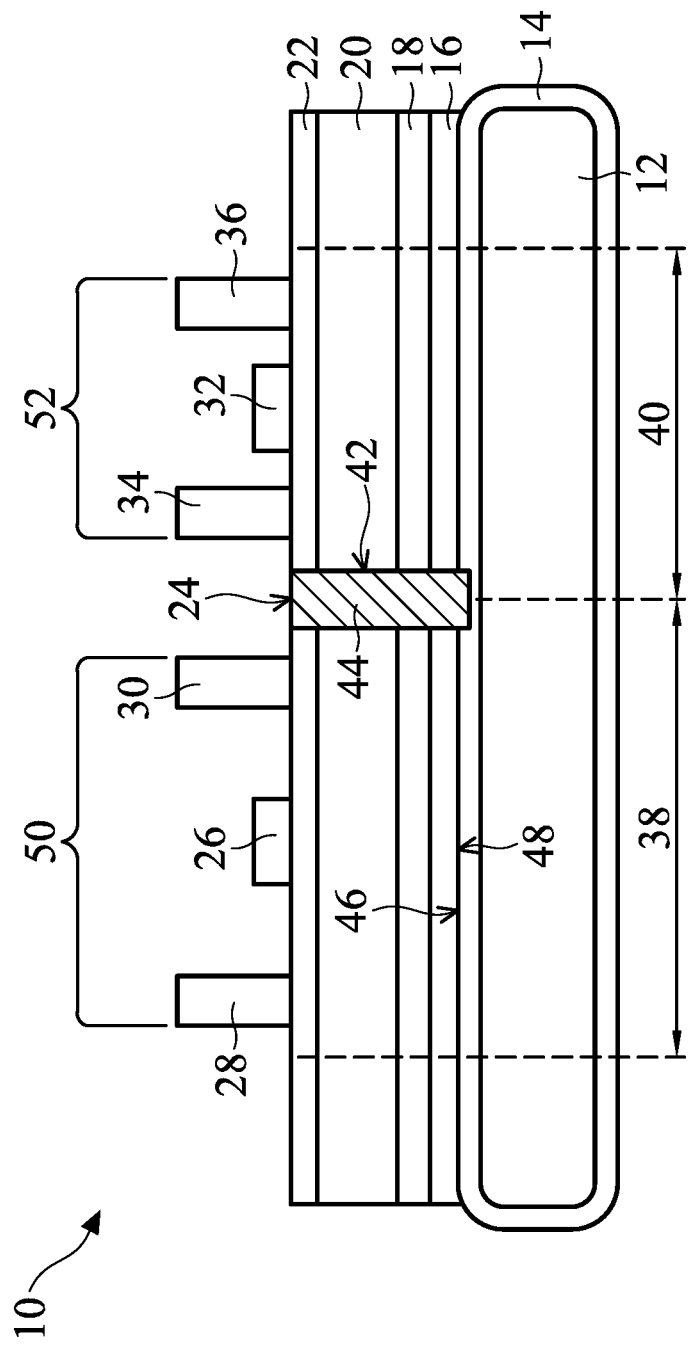
FIG. 2 is a cross-sectional view of a semiconductor structure in accordance with one embodiment of the disclosure.

Referring to FIG. 2, in accordance with one embodiment of the disclosure, a semiconductor structure 10 is provided. FIG. 2 is a cross-sectional view of the semiconductor structure 10.

As shown in FIG. 2, in this embodiment, the semiconductor structure 10 comprises an insulating substrate 12, an engineered layer 14, a nucleation layer 16, a buffer layer 18, a first epitaxial layer 20, a second epitaxial layer 22, an isolation structure 24, a first gate 26, a first source 28, a first drain 30, a second gate 32, a second source 34 and a second drain 36.

As shown in FIG. 2, the insulating substrate 12 comprises a first region 38 and a second region 40. The engineered layer 14 surrounds the insulating substrate 12. The nucleation layer 16 is formed on the engineered layer 14. The buffer layer 18 is formed on the nucleation layer 16. The first epitaxial layer 20 is formed on the buffer layer 18. The second epitaxial layer 22 is formed on the first epitaxial layer 20. Specifically, the isolation structure 24 is at least formed in the second epitaxial layer 22, the first epitaxial layer 20 and the nucleation layer 16. The isolation structure 24 is located between the first region 38 and the second region 40. The first gate 26 is formed on the second epitaxial layer 22 within the first region 38. The first source 28 and the first drain 30 are formed on the second epitaxial layer 22 within the first region 38. The first source 28 and the first drain 30 are located on both sides of the first gate 26. In addition, the second gate 32 is formed on the second epitaxial layer 22 within the second region 40. The second source 34 and the second drain 36 are formed on the second epitaxial layer 22 within the second region 40. The second source 34 and the second drain 36 are located on both sides of the second gate 32.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

In accordance with some embodiments, the buffer layer 18 may comprise aluminum gallium nitride or aluminum nitride.

In accordance with some embodiments, the first epitaxial layer 20 may comprise gallium nitride.

In accordance with some embodiments, the second epitaxial layer 22 may comprise aluminum gallium nitride.

In accordance with some embodiments, the isolation structure 24 may comprise a trench filled with an insulating material or an implant region.

In this embodiment, the isolation structure 24 comprises a trench 42 filled with an insulating material 44 passing through the second epitaxial layer 22, the first epitaxial layer 20, the buffer layer 18, the nucleation layer 16 and a portion of the engineered layer 14. That is, the isolation structure 24 extends from the second epitaxial layer 22 to anywhere in the engineered layer 14.

In accordance with some embodiments, the insulating material 44 filled into the trench 42 may comprise oxide, nitride followed by oxide, or oxide followed by polysilicon.

In accordance with some embodiments, the trench 42 may leave an "air gap" or "void" therein, as long as the top of the trench 42 is "sealed" so that no material falls or gets trapped inside the trench 42.

In accordance with some embodiments, the first gate 26, the first source 28 and the first drain 30 constitute a high-voltage device 50.

In accordance with some embodiments, the second gate 32, the second source 34 and the second drain 36 constitute a low-voltage device 52.

Figure 3:
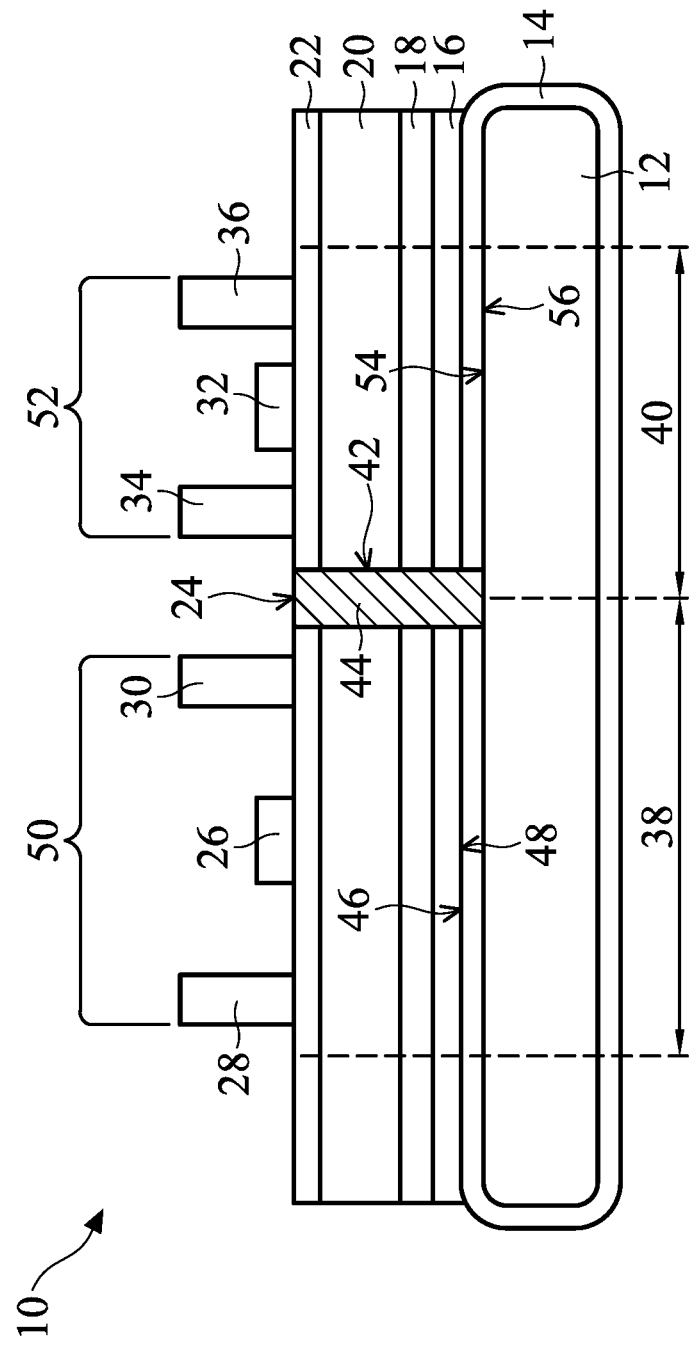
FIG. 3 is a cross-sectional view of a semiconductor structure in accordance with one embodiment of the disclosure.

Referring to FIG. 3, in accordance with one embodiment of the disclosure, a semiconductor structure 10 is provided. FIG. 3 is a cross-sectional view of the semiconductor structure 10.

As shown in FIG. 3, in this embodiment, the semiconductor structure 10 comprises an insulating substrate 12, an engineered layer 14, a nucleation layer 16, a buffer layer 18, a first epitaxial layer 20, a second epitaxial layer 22, an isolation structure 24, a first gate 26, a first source 28, a first drain 30, a second gate 32, a second source 34 and a second drain 36.

As shown in FIG. 3, the insulating substrate 12 comprises a first region 38 and a second region 40. The engineered layer 14 surrounds the insulating substrate 12. The nucleation layer 16 is formed on the engineered layer 14. The buffer layer 18 is formed on the nucleation layer 16. The first epitaxial layer 20 is formed on the buffer layer 18. The second epitaxial layer 22 is formed on the first epitaxial layer 20. Specifically, the isolation structure 24 is at least formed in the second epitaxial layer 22, the first epitaxial layer 20 and the nucleation layer 16. The isolation structure 24 is located between the first region 38 and the second region 40. The first gate 26 is formed on the second epitaxial layer 22 within the first region 38. The first source 28 and the first drain 30 are formed on the second epitaxial layer 22 within the first region 38. The first source 28 and the first drain 30 are located on both sides of the first gate 26. In addition, the second gate 32 is formed on the second epitaxial layer 22 within the second region 40. The second source 34 and the second drain 36 are formed on the second epitaxial layer 22 within the second region 40. The second source 34 and the second drain 36 are located on both sides of the second gate 32.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 µm to about 5 µm.

In accordance with some embodiments, the nucleation layer 16 has a lattice constant which is relatively close to the lattice constant of the epitaxial layer (for example GaN) to be grown on top.

In accordance with some embodiments, the buffer layer 18 may comprise aluminum gallium nitride or aluminum nitride.

In accordance with some embodiments, the first epitaxial layer 20 may comprise gallium nitride.

In accordance with some embodiments, the second epitaxial layer 22 may comprise aluminum gallium nitride.

In accordance with some embodiments, the isolation structure 24 may comprise a trench filled with an insulating material or an implant region.

In this embodiment, the isolation structure 24 comprises a trench 42 filled with an insulating material 44 passing through the second epitaxial layer 22, the first epitaxial layer 20, the buffer layer 18, the nucleation layer 16 and the engineered layer 14. That is, the isolation structure 24 extends from the second epitaxial layer 22 to the bottom surface 54 of the engineered layer 14 (i.e. the top surface 56 of the insulating substrate 12).

In accordance with some embodiments, the insulating material 44 filled into the trench 42 may comprise oxide, nitride followed by oxide, or oxide followed by polysilicon.

In accordance with some embodiments, the trench 42 may leave an "air gap" or "void" therein, as long as the top of the trench 42 is "sealed" so that no material falls or gets trapped inside the trench 42.

In accordance with some embodiments, the first gate 26, the first source 28 and the first drain 30 constitute a high-voltage device 50.

In accordance with some embodiments, the second gate 32, the second source 34 and the second drain 36 constitute a low-voltage device 52.

Figure 4:
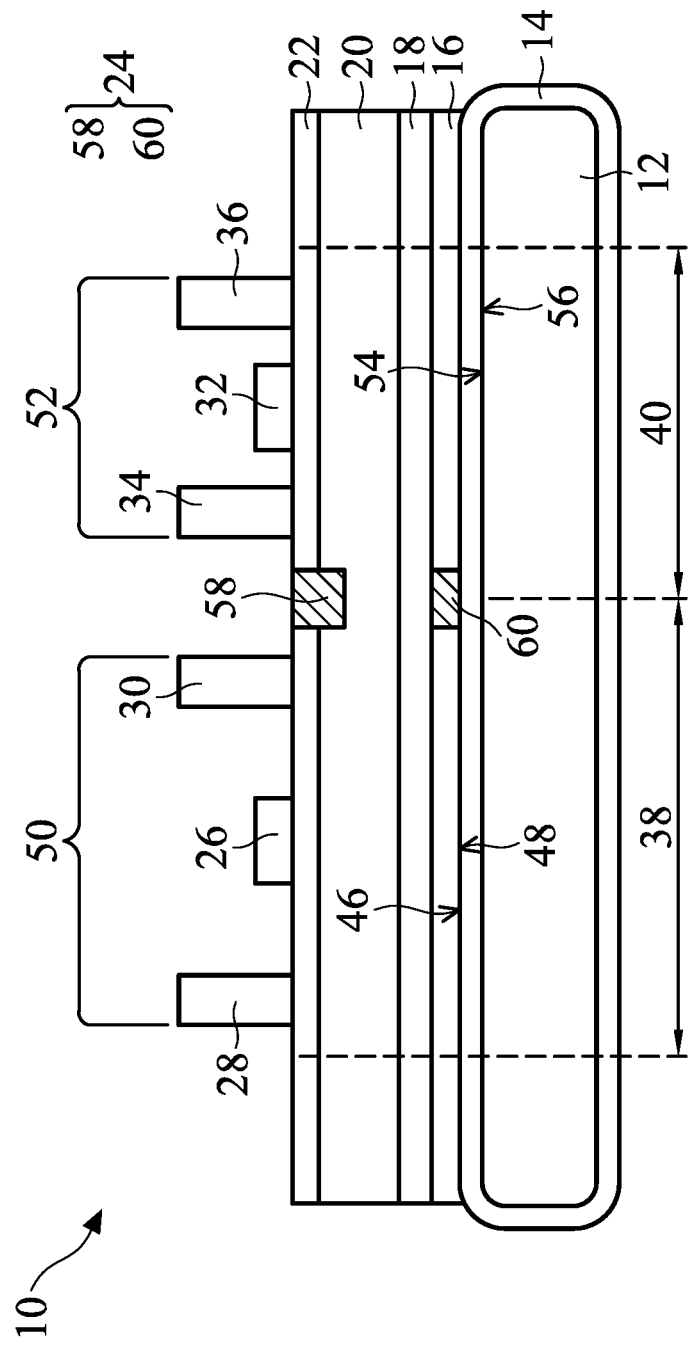
FIG. 4 is a cross-sectional view of a semiconductor structure in accordance with one embodiment of the disclosure.

Referring to FIG. 4, in accordance with one embodiment of the disclosure, a semiconductor structure 10 is provided. FIG. 4 is a cross-sectional view of the semiconductor structure 10.

As shown in FIG. 4, in this embodiment, the semiconductor structure 10 comprises an insulating substrate 12, an engineered layer 14, a nucleation layer 16, a buffer layer 18, a first epitaxial layer 20, a second epitaxial layer 22, an isolation structure 24, a first gate 26, a first source 28, a first drain 30, a second gate 32, a second source 34 and a second drain 36.

As shown in FIG. 4, the insulating substrate 12 comprises a first region 38 and a second region 40. The engineered layer 14 surrounds the insulating substrate 12. The nucleation layer 16 is formed on the engineered layer 14. The buffer layer 18 is formed on the nucleation layer 16. The first epitaxial layer 20 is formed on the buffer layer 18. The second epitaxial layer 22 is formed on the first epitaxial layer 20. Specifically, the isolation structure 24 is at least formed in the second epitaxial layer 22, the first epitaxial layer 20 and the nucleation layer 16. The isolation structure 24 is located between the first region 38 and the second region 40. The first gate 26 is formed on the second epitaxial layer 22 within the first region 38. The first source 28 and the first drain 30 are formed on the second epitaxial layer 22 within the first region 38. The first source 28 and the first drain 30 are located on both sides of the first gate 26. In addition, the second gate 32 is formed on the second epitaxial layer 22 within the second region 40. The second source 34 and the second drain 36 are formed on the second epitaxial layer 22 within the second region 40. The second source 34 and the second drain 36 are located on both sides of the second gate 32.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

In accordance with some embodiments, the buffer layer 18 may comprise aluminum gallium nitride or aluminum nitride.

In accordance with some embodiments, the first epitaxial layer 20 may comprise gallium nitride.

In accordance with some embodiments, the second epitaxial layer 22 may comprise aluminum gallium nitride.

In accordance with some embodiments, the isolation structure 24 may comprise a trench filled with an insulating material or an implant region.

In this embodiment, the isolation structure 24 comprises a first implant region 58 and a second implant region 60. Specifically, the first implant region 58 (i.e. a shallow implant region) is located in the second epitaxial layer 22 and the first epitaxial layer 20. The second implant region 60 (i.e. a deep implant region) is located in the nucleation layer 16.

In accordance with some embodiments, the first implant region 58 and the second implant region 60 may comprise oxygen or nitrogen.

In accordance with some embodiments, the first gate 26, the first source 28 and the first drain 30 constitute a high-voltage device 50.

In accordance with some embodiments, the second gate 32, the second source 34 and the second drain 36 constitute a low-voltage device 52.

Figure 5:
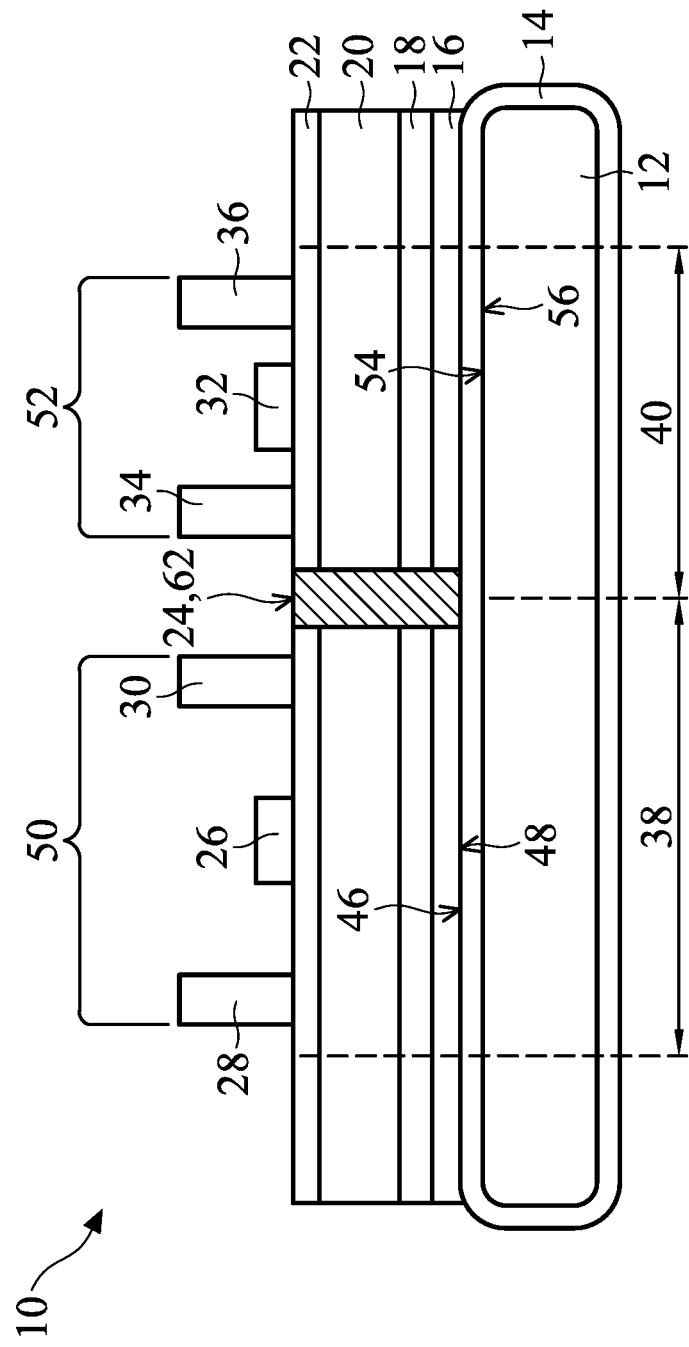
FIG. 5 is a cross-sectional view of a semiconductor structure in accordance with one embodiment of the disclosure.

Referring to FIG. 5, in accordance with one embodiment of the disclosure, a semiconductor structure 10 is provided. FIG. 5 is a cross-sectional view of the semiconductor structure 10.

As shown in FIG. 5, in this embodiment, the semiconductor structure 10 comprises an insulating substrate 12, an engineered layer 14, a nucleation layer 16, a buffer layer 18, a first epitaxial layer 20, a second epitaxial layer 22, an isolation structure 24, a first gate 26, a first source 28, a first drain 30, a second gate 32, a second source 34 and a second drain 36.

As shown in FIG. 5, the insulating substrate 12 comprises a first region 38 and a second region 40. The engineered layer 14 surrounds the insulating substrate 12. The nucleation layer 16 is formed on the engineered layer 14. The buffer layer 18 is formed on the nucleation layer 16. The first epitaxial layer 20 is formed on the buffer layer 18. The second epitaxial layer 22 is formed on the first epitaxial layer 20. Specifically, the isolation structure 24 is at least formed in the second epitaxial layer 22, the first epitaxial layer 20 and the nucleation layer 16. The isolation structure 24 is located between the first region 38 and the second region 40. The first gate 26 is formed on the second epitaxial layer 22 within the first region 38. The first source 28 and the first drain 30 are formed on the second epitaxial layer 22 within the first region 38. The first source 28 and the first drain 30 are located on both sides of the first gate 26. In addition, the second gate 32 is formed on the second epitaxial layer 22 within the second region 40. The second source 34 and the second drain 36 are formed on the second epitaxial layer 22 within the second region 40. The second source 34 and the second drain 36 are located on both sides of the second gate 32.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

In accordance with some embodiments, the buffer layer 18 may comprise aluminum gallium nitride or aluminum nitride.

In accordance with some embodiments, the first epitaxial layer 20 may comprise gallium nitride.

In accordance with some embodiments, the second epitaxial layer 22 may comprise aluminum gallium nitride.

In accordance with some embodiments, the isolation structure 24 may comprise a trench filled with an insulating material or an implant region.

In this embodiment, the isolation structure 24 comprises a continuous implant region 62 covering the second epitaxial layer 22, the first epitaxial layer 20, the buffer layer 18 and the nucleation layer 16.

In accordance with some embodiments, the continuous implant region 62 may comprise oxygen or nitrogen.

In accordance with some embodiments, the first gate 26, the first source 28 and the first drain 30 constitute a high-voltage device 50.

In accordance with some embodiments, the second gate 32, the second source 34 and the second drain 36 constitute a low-voltage device 52.

Referring to FIGS. 6A-6H, in accordance with one embodiment of the disclosure, a method for fabricating a semiconductor structure 10 is provided. FIGS. 6A-6H are cross-sectional views of the method for fabricating the semiconductor structure 10.

Figure 6A:
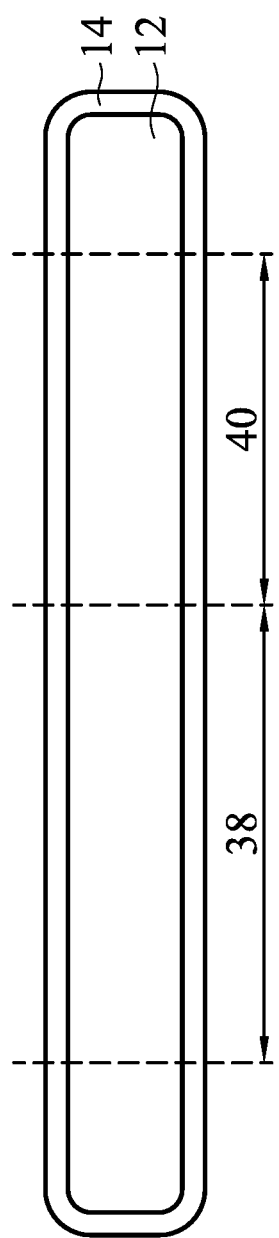

As shown in FIG. 6A, an insulating substrate 12 with an engineered layer 14 surrounding the insulating substrate 12 is provided. The insulating substrate 12 comprises a first region 38 and a second region 40.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

Figure 6B:
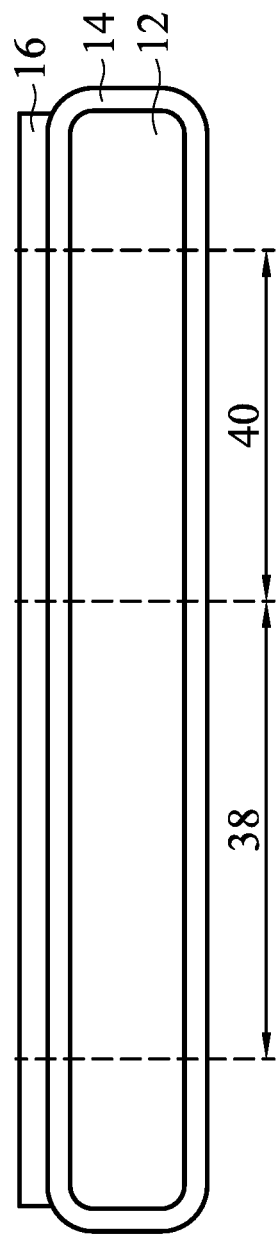

Next, as shown in FIG. 6B, a nucleation layer 16 is formed on the engineered layer 14 by appropriate deposition processes.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

The preparation of the nucleation layer 16 is further illustrated as follows. A hydrogen implantation is performed on a surface of a <111> silicon wafer to a depth that is in a range from about 0.3 μm to about 5 μm from the surface of the wafer. The wafer with the implant side is attached to the engineered layer 14 using a wafer bonding technique. The wafer is annealed and a cleave process is performed to break the silicon <111> wafer at the interface of the hydrogen implant. This leaves a thin silicon layer (e.g., the nucleation layer 16) on the engineered layer 14.

Figure 6C:
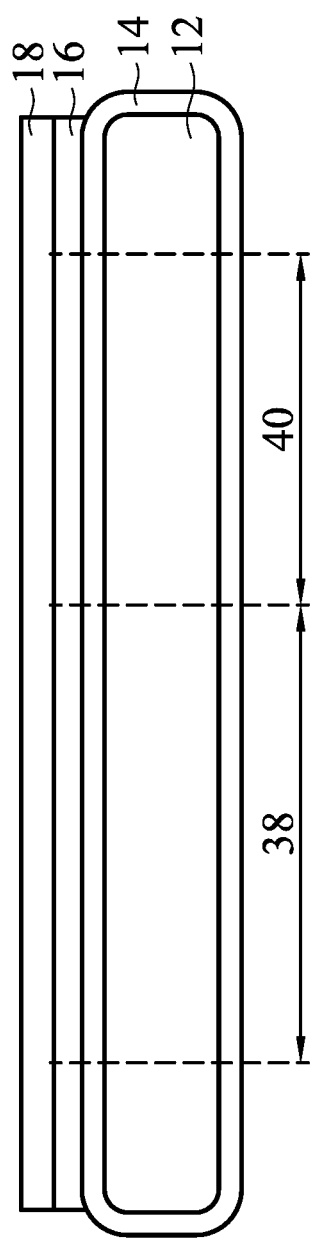

Next, as shown in FIG. 6C, a buffer layer 18 is formed on the nucleation layer 16 by appropriate epitaxy processes.

In accordance with some embodiments, the buffer layer 18 may comprise aluminum gallium nitride or aluminum nitride.

Figure 6D:
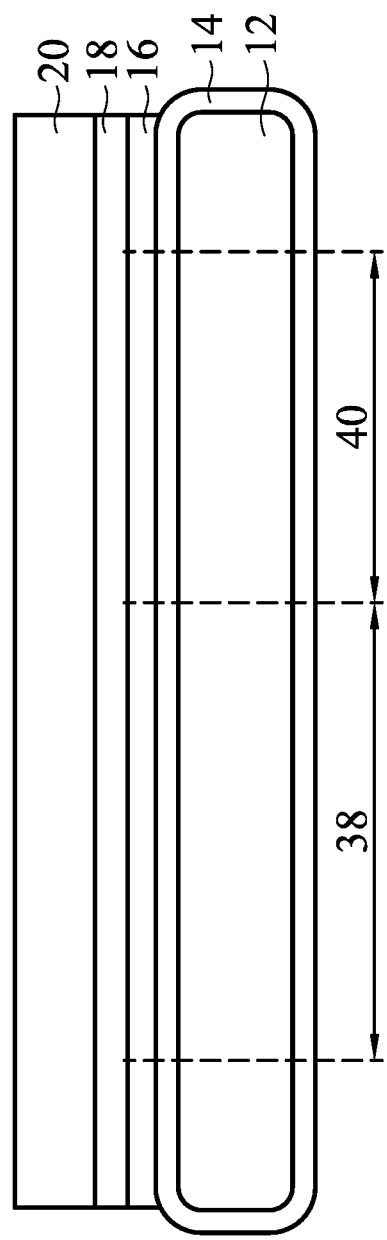

Next, as shown in FIG. 6D, a first epitaxial layer 20 is formed on the buffer layer 18 by appropriate epitaxy processes.

In accordance with some embodiments, the first epitaxial layer 20 may comprise gallium nitride.

Next, as shown in FIG. 6E, a second epitaxial layer 22 is formed on the first epitaxial layer 20 by appropriate epitaxy processes.

In accordance with some embodiments, the second epitaxial layer 22 may comprise aluminum gallium nitride.

In accordance with some embodiments, oxygen implantation or nitrogen implantation is further performed on the second epitaxial layer 22 and the first epitaxial layer 20 to form an implant region (not shown) therein.

Next, as shown in FIG. 6F, a patterned photoresist layer (not shown) for use as a mask is formed on the second epitaxial layer 22 to define a subsequently formed isolation structure.

The second epitaxial layer 22, the first epitaxial layer 20, the buffer layer 18 and the nucleation layer 16 are then etched using the mask to form a trench 42. An insulating material 44 is then filled into the trench 42 and planarized to form the isolation structure 24. The isolation structure 24 is located between the first region 38 and the second region 40.

In accordance with some embodiments, the insulating material 44 filled into the trench 42 may comprise oxide, nitride followed by oxide, or oxide followed by polysilicon.

In accordance with some embodiments, the trench 42 may leave an "air gap" or "void" therein, as long as the top of the trench 42 is "sealed" so that no material falls or gets trapped inside the trench 42.

In accordance with some embodiments, before the insulating material 44 is filled into the trench 42, a nitride material is formed on the sidewalls and the bottom of the trench 42 to form a liner (not shown).

In accordance with some embodiments, the isolation structure 24 may be formed by etching a trench 42 passing through the second epitaxial layer 22, the first epitaxial layer 20, the buffer layer 18, the nucleation layer 16 and a portion of the engineered layer 14, and then filling the insulating material 44 into the trench 42, as shown in FIG. 2.

In accordance with some embodiments, the isolation structure 24 may be formed by etching a trench 42 passing through the second epitaxial layer 22, the first epitaxial layer 20, the buffer layer 18, the nucleation layer 16 and the engineered layer 14, and then filling the insulating material 44 into the trench 42, as shown in FIG. 3.

Next, as shown in FIG. 6G, a first gate 26 is formed on the second epitaxial layer 22 within the first region 38. A first source 28 and a first drain 30 are formed on the second epitaxial layer 22 within the first region 38. The first source 28 and the first drain 30 are located on both sides of the first gate 26.

In accordance with some embodiments, the first gate 26, the first source 28 and the first drain 30 constitute a high-voltage device 50.

Figure 6H:
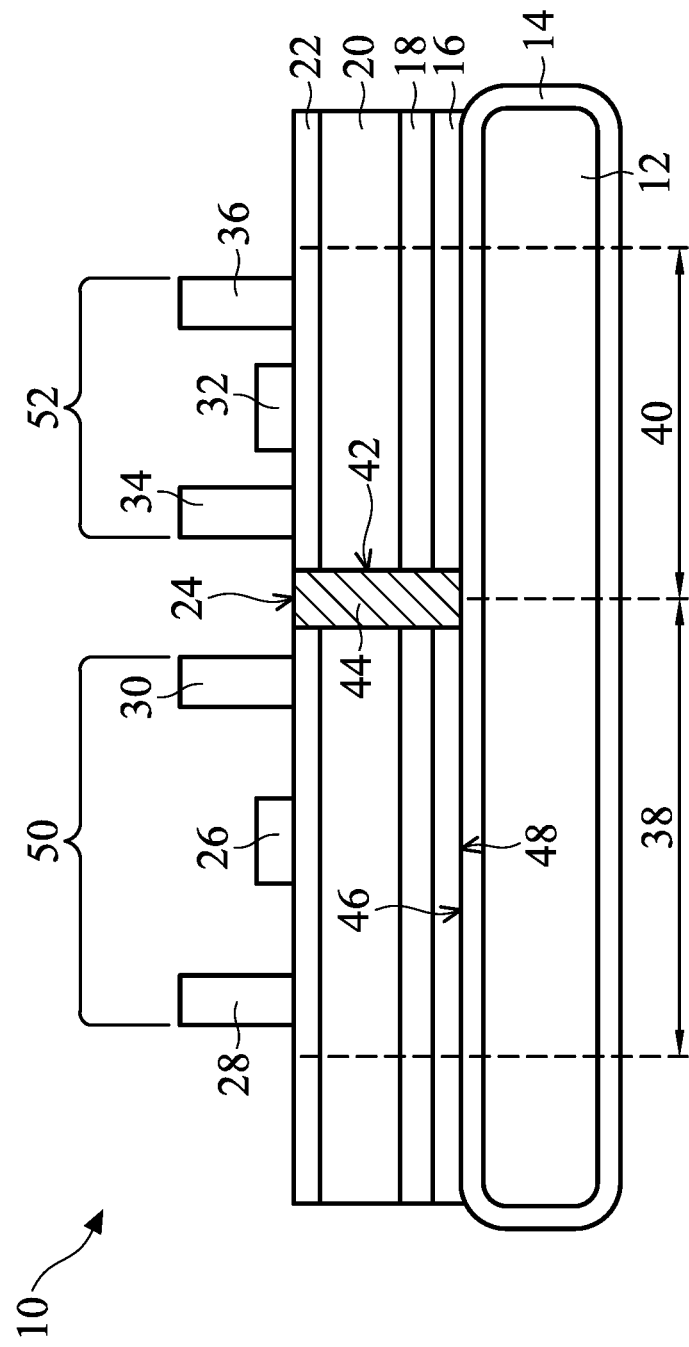

Next, as shown in FIG. 6H, a second gate 32 is formed on the second epitaxial layer 22 within the second region 40. A second source 34 and a second drain 36 are formed on the second epitaxial layer 22 within the second region 40. The second source 34 and the second drain 36 are located on both sides of the second gate 32.

In accordance with some embodiments, the second gate 32, the second source 34 and the second drain 36 constitute a low-voltage device 52.

The semiconductor structure 10 provided in this embodiment is therefore fabricated.

Next, subsequent appropriate processes, such as passivation, field plate formation and power interconnection, are performed.

Referring to FIGS. 7A-7I, in accordance with one embodiment of the disclosure, a method for fabricating a semiconductor structure 10 is provided. FIGS. 7A-7I are cross-sectional views of the method for fabricating the semiconductor structure 10.

Figure 7A:
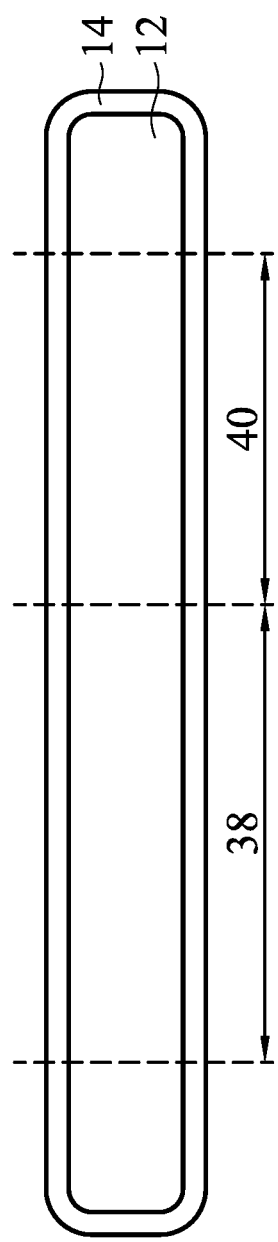
FIGS. 7A-7I are cross-sectional views of a method for fabricating a semiconductor structure in accordance with one embodiment of the disclosure.

As shown in FIG. 7A, an insulating substrate 12 with an engineered layer 14 surrounding the insulating substrate 12 is provided. The insulating substrate 12 comprises a first region 38 and a second region 40.

In accordance with some embodiments, the insulating substrate 12 has a coefficient of thermal expansion (CTE) that is similar to the CTE of the first epitaxial layer 20.

In accordance with some embodiments, the insulating substrate 12 has a bulk resistivity that is greater than about $10^6$ ohm-cm.

In accordance with some embodiments, the insulating substrate 12 has a thermal conductivity that is higher than that of silicon.

In accordance with some embodiments, the insulating substrate 12 may comprise aluminum nitride, polycrystalline silicon carbide, polycrystalline diamond, or a mixture of different polycrystalline materials, or other suitable insulating material.

In accordance with some embodiments, the engineered layer 14 may comprise nitride, oxide, oxynitride or polysilicon.

Figure 7B:
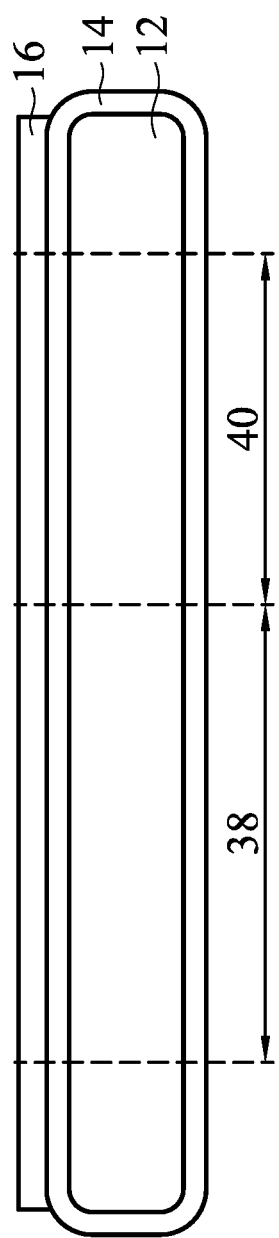

Next, as shown in FIG. 7B, a nucleation layer 16 is formed on the engineered layer 14 by appropriate deposition processes.

In accordance with some embodiments, the nucleation layer 16 may comprise silicon <111>.

In accordance with some embodiments, the nucleation layer 16 may be crystalline.

In accordance with some embodiments, the nucleation layer 16 has a thickness that is in a range from about 0.1 μm to about 5 μm.

In accordance with some embodiments, the nucleation layer 16 has a lattice constant which is relatively close to the lattice constant of the epitaxial layer (for example GaN) to be grown on top.

Figure 7C:
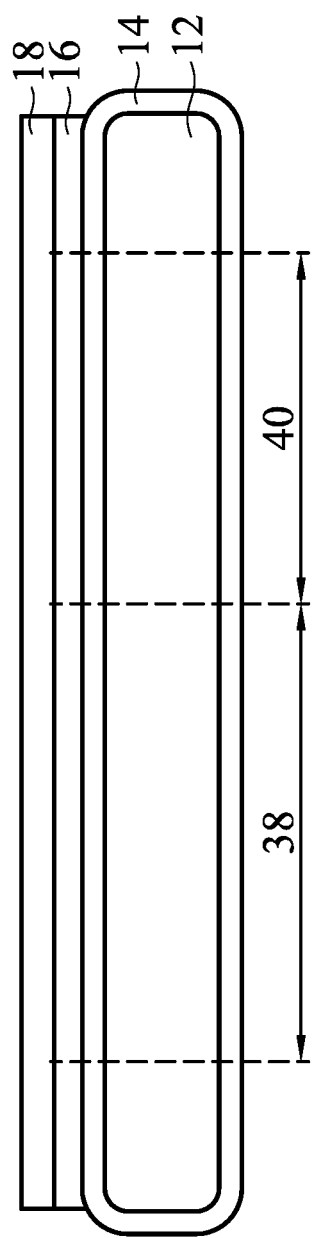

Next, as shown in FIG. 7C, a buffer layer 18 is formed on the nucleation layer 16 by appropriate epitaxy processes.

In accordance with some embodiments, the buffer layer 18 may comprise aluminum gallium nitride or aluminum nitride.

Figure 7D:
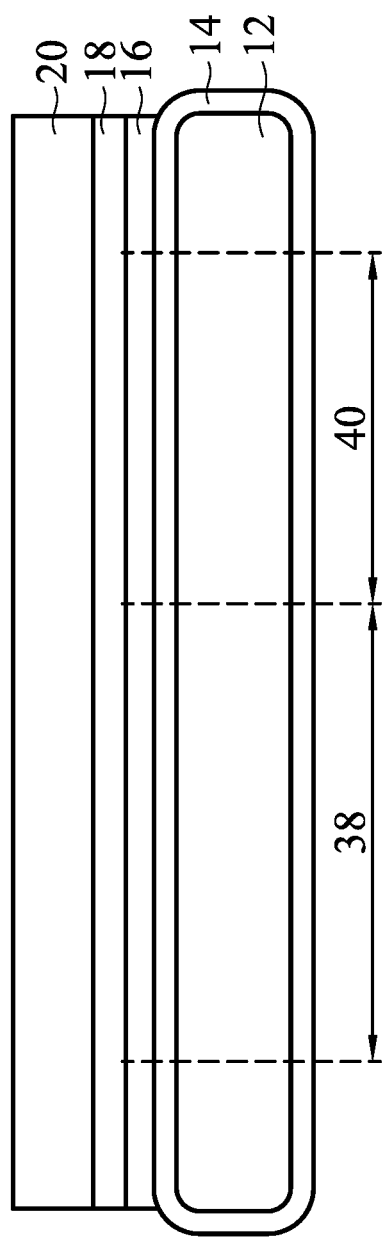

Next, as shown in FIG. 7D, a first epitaxial layer 20 is formed on the buffer layer 18 by appropriate epitaxy processes.

In accordance with some embodiments, the first epitaxial layer 20 may comprise gallium nitride.

Figure 7E:
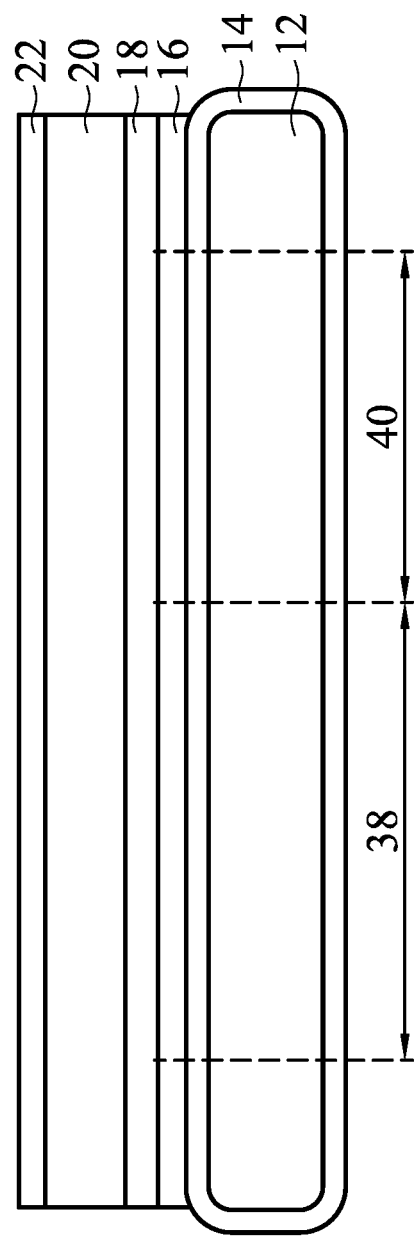

Next, as shown in FIG. 7E, a second epitaxial layer 22 is formed on the first epitaxial layer 20 by appropriate epitaxy processes.

In accordance with some embodiments, the second epitaxial layer 22 may comprise aluminum gallium nitride.

Figure 7F:
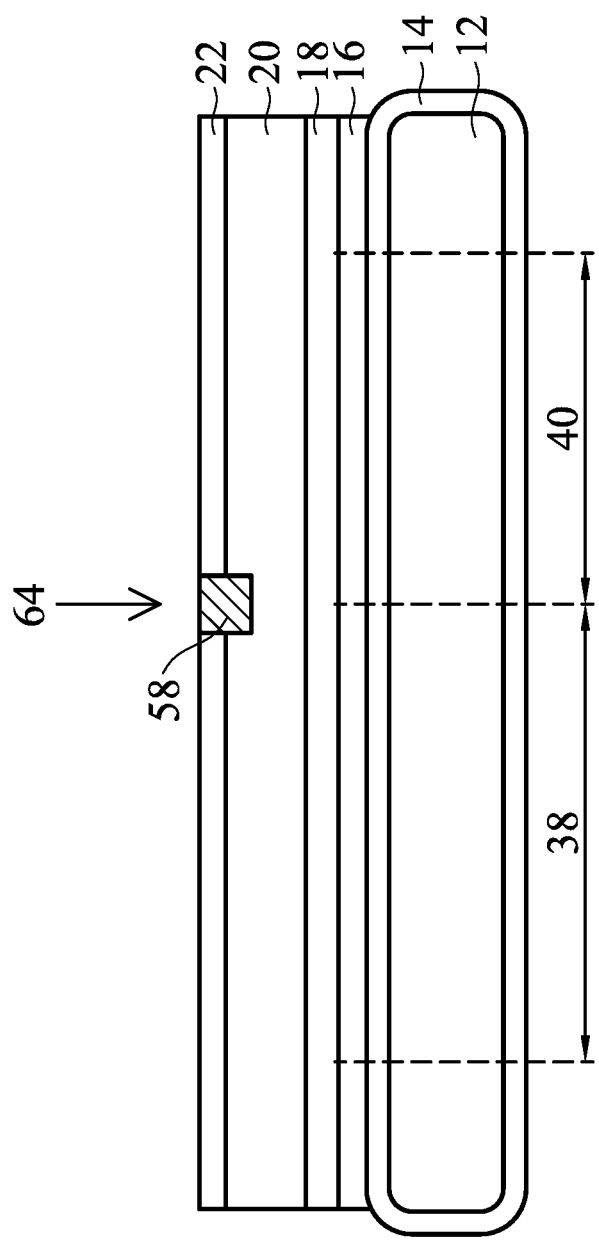

Next, as shown in FIG. 7F, a patterned photoresist layer (not shown) for use as a mask is formed on the second epitaxial layer 22 to define a subsequently formed isolation structure.

A first implantation 64 is then performed on the second epitaxial layer 22 and the first epitaxial layer 20 to form a first implant region 58 (i.e. a shallow implant region) therein. The first implant region 58 is located between the first region 38 and the second region 40.

In accordance with some embodiments, the first implantation 64 may be oxygen implantation or nitrogen implantation.

Figure 7G:
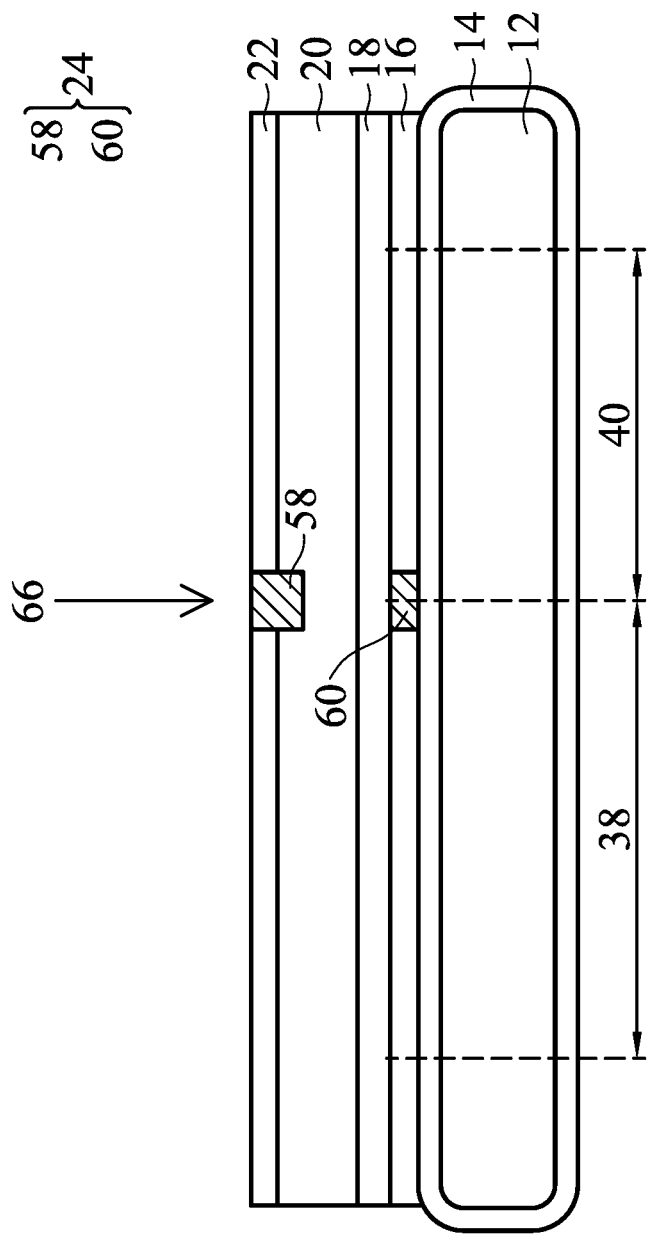

Next, as shown in FIG. 7G, a second implantation 66 is then performed on the nucleation layer 16 to form a second implant region 60 (i.e. a deep implant region) therein. The second implant region 60 is located between the first region 38 and the second region 40.

In accordance with some embodiments, the second implantation 66 may be oxygen implantation or nitrogen implantation.

In this embodiment, the first implant region 58 and the second implant region 60 constitute the isolation structure 24.

In this embodiment, the first implant region 58 in the shallow region and the second implant region 60 in the deep region are respectively formed by adjusting the intensities of the first implantation 64 and the second implantation 66 to achieve the purpose of damaging 2DEG layer and blocking the nucleation layer 16.

In accordance with some embodiments, after a patterned photoresist layer (not shown) for use as a mask is formed on the second epitaxial layer 22, an implantation such as oxygen implantation or nitrogen implantation may be performed on the second epitaxial layer 22, the first epitaxial layer 20, the buffer layer 18 and the nucleation layer 16 to form a continuous implant region 62 (i.e. an isolation structure) therein, as shown in FIG. 5. The continuous implant region 62 is located between the first region 38 and the second region 40.

Figure 7H:
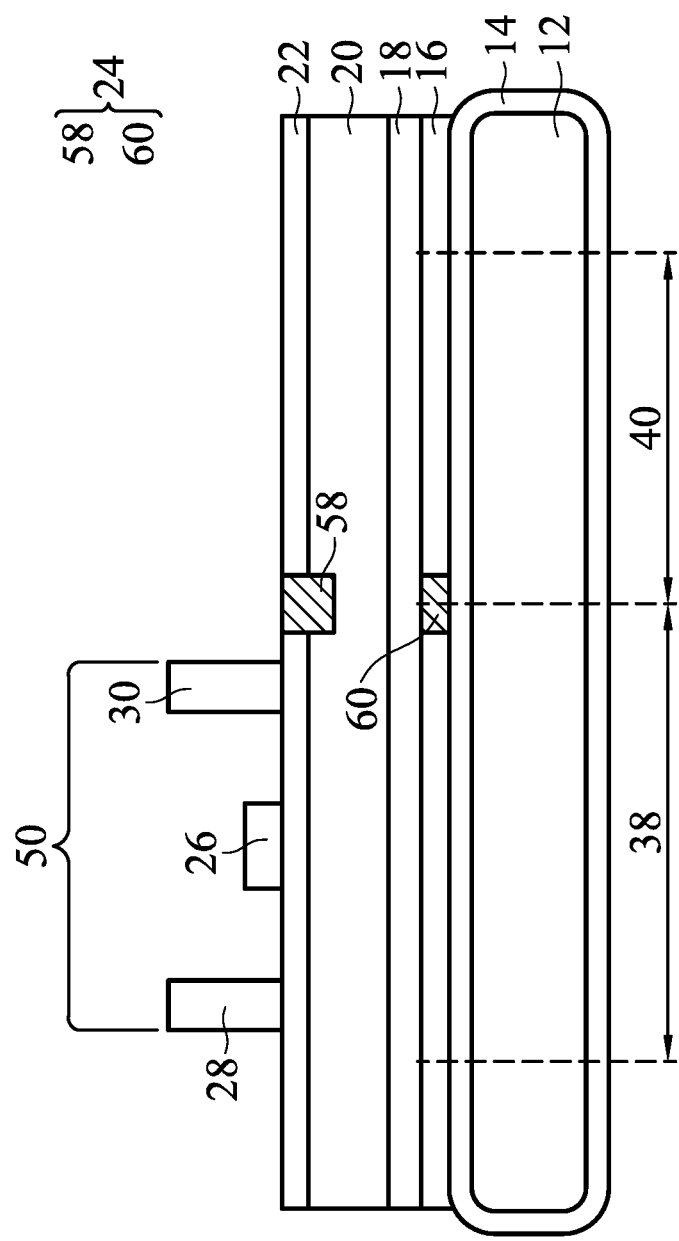

Next, as shown in FIG. 7H, a first gate 26 is formed on the second epitaxial layer 22 within the first region 38. A first source 28 and a first drain 30 are formed on the second epitaxial layer 22 within the first region 38. The first source 28 and the first drain 30 are located on both sides of the first gate 26.

In accordance with some embodiments, the first gate 26, the first source 28 and the first drain 30 constitute a high-voltage device 50.

Figure 7I:
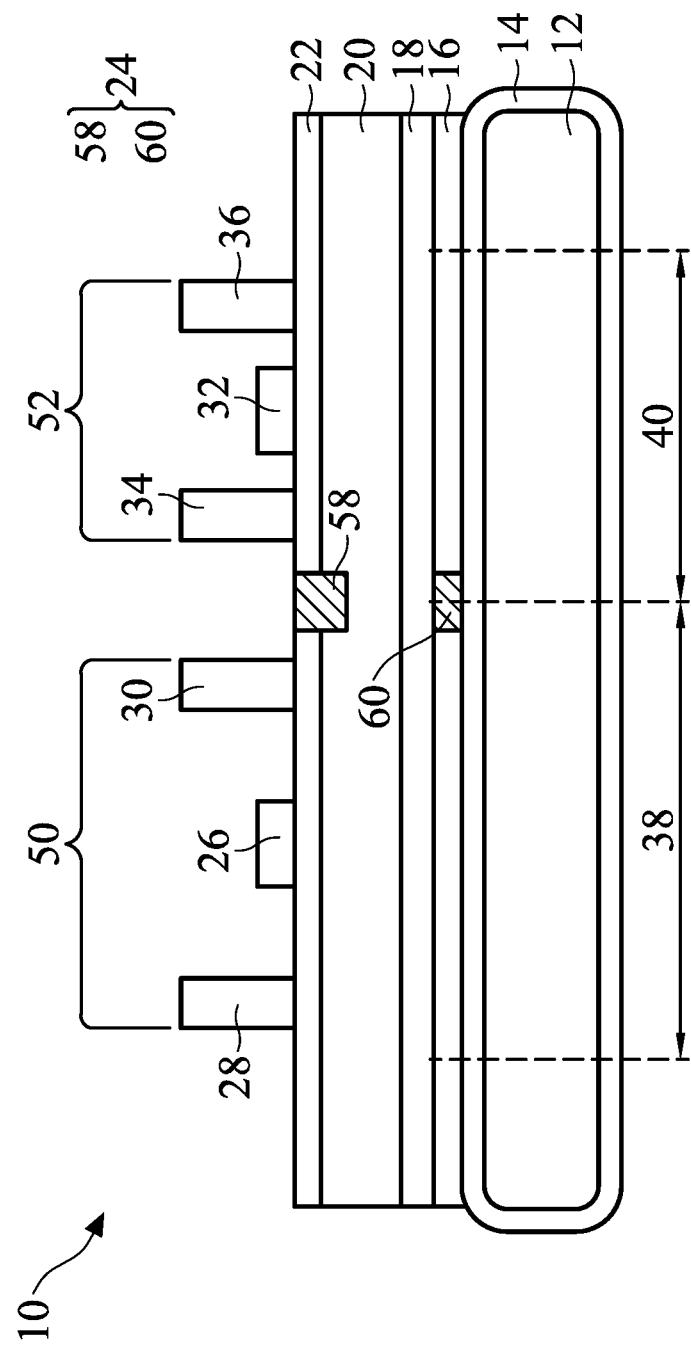

Next, as shown in FIG. 7I, a second gate 32 is formed on the second epitaxial layer 22 within the second region 40. A second source 34 and a second drain 36 are formed on the second epitaxial layer 22 within the second region 40. The second source 34 and the second drain 36 are located on both sides of the second gate 32.

In accordance with some embodiments, the second gate 32, the second source 34 and the second drain 36 constitute a low-voltage device 52.

The semiconductor structure 10 provided in this embodiment is therefore fabricated.

Next, subsequent appropriate processes, such as passivation, field plate formation and power interconnection, are performed.

In the semiconductor structure disclosed by the present invention, an insulating core substrate (such as aluminum nitride) having the following appropriate characteristics, for example, similar coefficient of thermal expansion (CTE) to those of transistor material layers, high bulk resistivity, high thermal conductivity and low cost, which is further surrounded by a particular engineered layer (such as oxide, nitride, oxynitride or polysilicon) is used to replace a conventional semiconductor silicon substrate. A simple isolation structure, such as a single trench filled with an insulating material or separated implant regions (including a shallow implant region and a deep implant region), is also formed in this semiconductor structure to destroy a two-dimensional electron gas (2DEG) layer and to block a semiconductor nucleation layer to ensure that no electrical connection is formed between adjacent devices. Therefore, there is no need to form a bias connection to the substrate and no need to form complex and expensive conductors in deep trenches to connect the nucleation layer or the substrate since the core substrate is an insulator (no back bias effect occurs). The disclosure provides simple process steps and electrical connection indeed. In addition, multiple devices (such as active devices and/or passive devices) whose terminals are applied by different electrical voltages are capable of being integrated on the same die.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
    an insulating substrate comprising a first region and a second region;
    an engineered layer surrounding the insulating substrate;
    a nucleation layer formed on the engineered layer;
    a buffer layer formed on the nucleation layer;
    a first epitaxial layer formed on the buffer layer;
    a second epitaxial layer formed on the first epitaxial layer;
    an isolation structure at least formed in the second epitaxial layer, the first epitaxial layer, the buffer layer and the nucleation layer, and located between the first region and the second region;
    a first gate formed on the second epitaxial layer within the first region;
    a first source and a first drain formed on the second epitaxial layer within the first region, wherein the first source and the first drain are located on both sides of the first gate;
    a second gate formed on the second epitaxial layer within the second region; and
    a second source and a second drain formed on the second epitaxial layer within the second region, wherein the second source and the second drain are located on both sides of the second gate.

2. The semiconductor structure as claimed in claim 1, wherein the insulating substrate has a coefficient of thermal expansion (CTE) that is similar to that of the first epitaxial layer.

3. The semiconductor structure as claimed in claim 1, wherein the insulating substrate has a bulk resistivity that is greater than $10^6$ ohm-cm.

4. The semiconductor structure as claimed in claim 1, wherein the insulating substrate has a thermal conductivity that is higher than that of silicon.

5. The semiconductor structure as claimed in claim 1, wherein the insulating substrate comprises aluminum nitride, polycrystalline silicon carbide, polycrystalline diamond, or a mixture thereof.

6. The semiconductor structure as claimed in claim 1, wherein the engineered layer comprises nitride, oxide, oxynitride or polysilicon.

7. The semiconductor structure as claimed in claim 1, wherein the nucleation layer comprises silicon <111>.

8. The semiconductor structure as claimed in claim 1, wherein the nucleation layer is crystalline.

9. The semiconductor structure as claimed in claim 1, wherein the nucleation layer has a thickness that is in a range from about 0.1 μm to about 5 μm.

10. The semiconductor structure as claimed in claim 1, wherein the buffer layer comprises aluminum gallium nitride or aluminum nitride.

11. The semiconductor structure as claimed in claim 1, wherein the first epitaxial layer comprises gallium nitride.

12. The semiconductor structure as claimed in claim 1, wherein the second epitaxial layer comprises aluminum gallium nitride.

13. The semiconductor structure as claimed in claim 1, wherein the isolation structure comprises a trench filled with an insulating material passing through the second epitaxial layer, the first epitaxial layer, the buffer layer, and the nucleation layer.

14. The semiconductor structure as claimed in claim 1, wherein the isolation structure comprises a trench filled with an insulating material passing through the second epitaxial layer, the first epitaxial layer, the buffer layer, the nucleation layer, and a portion of the engineered layer.

15. The semiconductor structure as claimed in claim 13, wherein the insulating material comprises oxide, nitride followed by oxide, or oxide followed by polysilicon.

16. The semiconductor structure as claimed in claim 1, wherein the isolation structure comprises a first implant region and a second implant region.

17. The semiconductor structure as claimed in claim 16, wherein the first implant region is located in the second epitaxial layer and the first epitaxial layer.

18. The semiconductor structure as claimed in claim 16, wherein the second implant region is located in the nucleation layer.

19. The semiconductor structure as claimed in claim 1, wherein the isolation structure comprises a continuous implant region covering sides of the second epitaxial layer, the first epitaxial layer, the buffer layer, and the nucleation layer.

20. The semiconductor structure as claimed in claim 1, wherein the first gate, the first source, and the first drain constitute a high-voltage device.

21. The semiconductor structure as claimed in claim 1, wherein the second gate, the second source, and the second drain constitute a low-voltage device or a high-voltage device.

22. The semiconductor structure as claimed in claim 1, further comprising a third epitaxial layer formed on the second epitaxial layer.

23. The semiconductor structure as claimed in claim 22, wherein the third epitaxial layer is a p-type gallium nitride layer.

24. A method for fabricating a semiconductor structure, comprising:
    providing an insulating substrate comprising a first region and a second region with an engineered layer surrounding the insulating substrate;
    forming a nucleation layer on the engineered layer;
    forming a buffer layer on the nucleation layer;
    forming a first epitaxial layer on the buffer layer;

forming a second epitaxial layer on the first epitaxial layer;

forming an isolation structure at least in the second epitaxial layer, the first epitaxial layer, the buffer layer and the nucleation layer, and located between the first region and the second region;

forming a first gate on the second epitaxial layer within the first region;

forming a first source and a first drain on the second epitaxial layer within the first region, wherein the first source and the first drain are located on both sides of the first gate;

forming a second gate on the second epitaxial layer within the second region; and forming a second source and a second drain on the second epitaxial layer within the second region, wherein the second source and the second drain are located on both sides of the second gate.

25. The method for fabricating a semiconductor structure as claimed in claim 24, wherein the isolation structure is formed by etching a trench passing through the second epitaxial layer, the first epitaxial layer, the buffer layer, and the nucleation layer, and filling an insulating material into the trench.

26. The method for fabricating a semiconductor structure as claimed in claim 24, wherein the isolation structure is formed by etching a trench passing through the second epitaxial layer, the first epitaxial layer, the buffer layer, the nucleation layer, and a portion of the engineered layer, and filling an insulating material into the trench.

27. The method for fabricating a semiconductor structure as claimed in claim 24, wherein the isolation structure is formed by performing a first implantation on the second epitaxial layer and the first epitaxial layer.

28. The method for fabricating a semiconductor structure as claimed in claim 27, wherein the isolation structure is formed by further performing a second implantation on the nucleation layer.

29. The method for fabricating a semiconductor structure as claimed in claim 24, wherein the isolation structure is formed by performing an implantation on the second epitaxial layer, the first epitaxial layer, the buffer layer, and the nucleation layer.

* * * * *